(12) United States Patent
Schwindt et al.

(10) Patent No.: US 11,821,966 B1
(45) Date of Patent: Nov. 21, 2023

(54) OPTICALLY PUMPED, RADIO-FREQUENCY ATOMIC MAGNETOMETRY WITH FEEDBACK STABILIZATION

(71) Applicant: National Technology & Engineering Solutions of Sandia, LLC, Albuquerque, NM (US)

(72) Inventors: Peter D. D. Schwindt, Albuquerque, NM (US); Neil Claussen, Albuquerque, NM (US); Jonathan Edward Bainbridge, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 81 days.

(21) Appl. No.: 17/550,503

(22) Filed: Dec. 14, 2021

(51) Int. Cl.
*G01R 33/26* (2006.01)
*H01S 5/0687* (2006.01)
*G01C 19/62* (2006.01)

(52) U.S. Cl.
CPC .............. *G01R 33/26* (2013.01); *G01C 19/62* (2013.01); *H01S 5/0687* (2013.01)

(58) Field of Classification Search
CPC ........ G01R 33/26; G01C 19/62; H01S 5/0687
See application file for complete search history.

(56) References Cited

U.S. PATENT DOCUMENTS

2016/0116553 A1* 4/2016 Kim ..................... G01R 33/032
 324/304
2016/0223627 A1* 8/2016 Shah ....................... G01R 33/26

OTHER PUBLICATIONS

Savukov, I. M. et al., "Tunable Atomic Magnetometer for Detection of Radio-Frequency Magnetic Fields," Physical Review Letters, 2005, vol. 95, pp. 063004-1-063004-4.
Alexandrov, E. B. et al., "Three-Component Variometer Based on a Scalar Potassium Sensor," Measurement Science and Technology, 2004, vol. 15, pp. 918-922.
Bloom, A. L. "Principles of Operation of the Rubidium Vapor Magnetometer," Applied Optics, 1962, vol. 1, pp. 61-68.
Bainbirdge, J., "An RF Optically Pumped Magnetometer for Communication Through Lossy Media," 2020, SAND2020-4714PE, Sandia National Laboratories, Albuquerque, NM, 45 pages.
Tierney, T. M. et al., "Optically Pumped Magnetometers: From Quantum Origins to Multi-Channel Magnetoencephalography," NeuroImage, 2019, vol. 199, pp. 598-608.

(Continued)

*Primary Examiner* — Jay Patidar
(74) *Attorney, Agent, or Firm* — Martin I. Finston; Mark A. Dodd

(57) ABSTRACT

An optically pumped, atomic magnetometer incorporates a feedback system for stabilizing the magnetic bias field and suppressing unwanted background fields. The magnetic bias field is applied to a vapor cell containing host atoms of two different species, each of which resonates at a different Larmor frequency when both are subjected to the same magnetic bias field. One species provides the feedback for stabilizing the bias field, thereby creating a stabilizing magnetometer portion that nulls out the unwanted background fields. The other species provides magnetic field detection or signal reception on a radio communication frequency of interest, thereby creating a signal magnetometer portion that permits detection of the signal at the radio communication frequency.

9 Claims, 5 Drawing Sheets

(56) References Cited

OTHER PUBLICATIONS

Bradley, R. et al. "Microwave Cavity Searches for Dark-Matter Axions," Reviews of Modern Physics, 2003, vol. 75, pp. 777-817.

Chalupczak, W. et al. "Room Temperature Femtotesla Radio-Frequency Atomic Magnetometer," Applied Physics Letters, 2012, vol. 100, pp. 242401-1-242401-4.

Garroway, A. N. et al. "Remote Sensing by Nuclear Quadrupole Resonance," IEEE Transactions on Geoscience and Remote Sensing, 2001, vol. 39, pp. 1108-1118.

Gerginov, V. et al. "Prospects for Magnetic Field Communications and Location Using Quantum Sensors," Review of Scientific Instruments, 2017, vol. 88, pp. 125005-1-125005-10.

Ledbetter, M. P. et al. "Detection of Radio-Frequency Magnetic Fields Using Nonlinear Magneto-Optical Rotation," Physical Review A, 2007, vol. 75, pp. 023405-1-023405-6.

Lee, S.-K et al. "Subfemtotesla Radio-Frequency Atomic Magnetometer for Detection of Nuclear Quadrupole Resonance," Applied Physics Letters, 2006, vol. 89, pp. 214106-1-214106-3.

Savukov, I. M. et al., Detection of NMR Signals with a Radio-Frequency Atomic Magnetometer, Journal of Magnetic Resonance, 2007, vol. 185, pp. 214-220.

Savukov, I. M. et al., "High-Sensitivity Operation of Single-Beam Optically Pumped Magnetometer in a kHz Frequency Range," Measurement Science & Technology, 2017, vol. 28, 035104, 7 pages.

Savukov, I. M. et al., "MRI with an Atomic Magnetometer Suitable for Practical Imaging Applications," Journal of Magnetic Resonance, 2009, vol. 199, pp. 188-191.

Savukov, I. M. et al., "Ultra-Sensitive High-Density Rb-87 Radio-Frequency Magnetometer," Applied Physics Letters, 2014, vol. 104, pp. 023504-1-023504-3.

Seltzer, S. J. "Developments in Alkali-Metal Atomic Magnetometry," 2008, Chapter 4, Doctoral Dissertation, Princeton University, pp. 107-136.

Appelt, S. et al., "Theory of Spin-Exchange Optical Pumping of 3He and 129Xe," Physical Review A, 1998, vol. 58, pp. 1412-1439.

Fang, J. et al., "Optimizations of Spin-Exchange Relaxation-Free Magnetometer Based on Potassium and Rubidium Hybrid Optical Pumping," Review of Scientific Instruments, 2014, vol. 85, pp. 123104-1-123104-7; https://doi.org/10.1063/1.4902567.

Ito, Y. et al., "Sensitivity Improvement of Spin-Exchange Relaxation Free Atomic Magnetometers by Hybrid Optical Pumping of Potassium and Rubidium," IEEE Transactions on Magnetics, 2011, vol. 47, pp. 3550-3553.

\* cited by examiner

OPTICALLY PUMPED, RADIO-FREQUENCY ATOMIC MAGNETOMETRY WITH FEEDBACK STABILIZATION

STATEMENT OF GOVERNMENT RIGHTS

This invention was made with United States Government support under Contract No. DE-NA0003525 between National Technology & Engineering Solutions of Sandia, LLC and the United States Department of Energy/National Nuclear Security Administration. The United States Government has certain rights in this invention.

FIELD OF THE INVENTION

The invention relates to methods and apparatus for optically pumped atomic magnetometry.

ART BACKGROUND

Optically pumped atomic magnetometry is a known technique for measuring magnetic fields with high sensitivity. Very generally, a vapor of magnetically sensitive host atoms is magnetically polarized by pumping with a laser or other suitable light source. The resulting polarization vector precesses under the influence of an ambient magnetic field. The precession is observable from its modulating effect on a polarized beam of probe light transmitted through the atomic vapor. The precession frequency is proportional to the magnitude of the ambient magnetic field.

Resonance effects are observable when the atomic vapor is subjected to a magnetic field that oscillates at or near the precession frequency. For example, a magnetometer can be designed to produce a radio-frequency (RF) modulation of the probe light when it is driven by a near-resonant RF field, with a modulation depth that depends on the amount of detuning from resonance. Because the driving field can be produced by external sources, the magnetometer can be used as an RF detector or receiver at a frequency of interest. The frequency of interest can readily be scanned by simply varying the strength of the magnetic bias field.

Such a scheme has been proposed. For example, I.M. Savukov et al., "Tunable Atomic Magnetometer for Detection of Radio-Frequency Magnetic Fields," Phys. Rev. Lett. 95 (2005) 063004-1 (four pages), has reported a resonantly tuned alkali-metal magnetometer operating at 99 kHz with a sensitivity of 1 $fT/Hz^{1/2}$ to an oscillating field. The entirety of the above said paper by Savukov et al. is hereby incorporated herein by reference.

Although useful, the magnetometer of Savukov et al. and systems like it are limited in application, because of the need to exclude the terrestrial magnetic field and stray fields. For laboratory use, this is generally achieved by operating within magnetic shielding. For operation outside of a magnetic field, the undesired fields must be canceled using active feedback to a three-axis coil system. Although possible in principle, this is difficult because the terrestrial field is generally much larger than the fields that are to be measured, whereas highly sensitive magnetometers are generally limited to a dynamic range below the terrestrial field strength.

Accordingly, there is still a need for new magnetometer designs that can operate without magnetic shielding but can still exhibit extremely high sensitivity.

SUMMARY OF THE INVENTION

We have developed a new magnetometer suitable for use in a radio-frequency receiver. Our magnetometer incorporates a feedback system for stabilizing the magnetic bias field and suppressing unwanted background fields so that the device can be operated outside of a magnetic shield. We apply a unique approach that allows for a very compact design. A further advantage of our new magnetometer is that all of the information for the feedback comes from one source at one concentrated location.

According to our new approach, two species of host atom are included within the atomic vapor cell. For example, the host atoms may belong to two different isotopes of the same element, or they may correspond to nuclides of different elements. At a given value of the magnetic bias field, each species (after suitable optical pumping) resonates at a different frequency, but the two resonant frequencies stand in a known ratio. Accordingly, the vapor cell can serve as the heart of two coextensive magnetometers, both of which are subjected to the same magnetic bias field. One, which we refer to as the "signal magnetometer", can be tuned to the communication frequency, i.e., the frequency on which RF reception, e.g. for detecting an RF field or for receiving an information signal on such a field, is desired. The other, which we refer to as the "stabilizing magnetometer", is tuned to the second resonant frequency, which we refer to as the "stabilizing frequency". This second magnetometer is used solely to operate field coils to null out unwanted background fields.

The stabilization is performed by feeding error signals back to the controllers for field coils on the respective x-, y-, and z-axes. The error signals are directed so as to oppose changes that would detune the magnetic field on the vapor cell from the resonance at the stabilizing frequency. Because of the fixed ratio, stabilizing the bias field for one magnetometer will ipso facto stabilize it for the other magnetometer. In the discussion below, we will use the term "servo system" to describe the subsystem of our magnetometer that is responsible for stabilizing the magnetic field.

As noted above, the precession frequency, also often referred to as the "Larmor frequency", is proportional to the magnitude of the ambient magnetic field. The Larmor frequency is independent of the B-field direction, but the sensitivity drops to zero when the pump axis and the resulting polarization are orthogonal to the ambient magnetic field.

Although the Larmor frequency is independent of the field direction, it is still an object of the servo system to maintain not only the magnitude of the field $B_0$ applied to the vapor cell, but also its direction. More specifically, we define a longitudinal direction as the direction of the optical propagation axis for a pump beam of circularly polarized light as it propagates through the vapor cell, and a transverse plane that is perpendicular to that axis. By convention, we identify the longitudinal axis as the z-axis, and we identify the transverse plane as the xy-plane. Our servo system is designed to stabilize $B_0$ in all three coordinate directions.

The servo system operates in two stages. In a longitudinal stabilization (LS) stage, small-amplitude modulations are imposed at a frequency $f_{LS}$ on a transverse component, e.g., on $B_{0x}$ of $B_0$, and the magnetometer response is fed back as an error signal. In a transverse stabilization (TS) stage, small-amplitude modulations are imposed at a lower frequency $f_{TS}$ on the transverse components $B_{0x}$ and $B_{0y}$ of $B_0$, and the magnetometer response is fed back as an error signal. As will be explained in greater detail below, the x and y modulations differ in phase by 90°, so that the combined transverse field takes the form of a small, perturbing magnetic field that rotates in the xy-plane.

The magnetometer response takes the physical form of electrical output from a balanced photodetector. It is noteworthy that when the probe beam reaches the photodetector, it bears, encoded within it, the longitudinal modulation at frequency $f_{LS}$, the transverse modulation at the lower frequency $f_{TS}$, and the modulation, if any, at the desired communication frequency $f_{Comm}$. The recovery of the respective error signals is achieved through a cascaded sequence of demodulations. First, the photodetector output is demodulated at frequency $f_{LS}$. This produces a longitudinal error waveform that is marked with higher-frequency modulations.

The once-demodulated signal is then demodulated a second time, at frequency $f_{TS}$. Both in-phase (I) and quadrature (Q) output waveforms are taken from the demodulator, yielding a two-channel error waveform. The I channel provides the error signal for the x field coils, and the Q channel provides the error signal for the y field coils.

The communication signal is recovered from the photodetector output in an independent demodulation, at the communication frequency $f_{Comm}$.

In an example, the host species for the servo system is $^{87}$Rb, and the host species for the RF receiver is $^{85}$Rb. Both species are provided by loading a vapor cell with natural-abundance rubidium. Because of the difference in nuclear spins, the gyromagnetic ratio of $^{85}$Rb is two-thirds the gyromagnetic ratio of $^{87}$Rb. Accordingly, the resonant excitation of $^{87}$Rb should, under idealizing assumptions, be at three-halves the desired RF communication frequency.

As those skilled in the art will be aware, an effect known in the art as the vector light shift can theoretically perturb the resonant frequencies by a small amount. However, we have not observed significant consequences of this effect, in practice. Notably, theory also predicts that this effect is compensable with slight adjustments to the detuning of the pump laser.

Although it may not be the case for all possible systems of host species, the same laser frequency can be used to pump both the $^{85}$Rb atoms and the $^{87}$Rb atoms to the desired states for magnetometer operation.

Accordingly, the invention in a first aspect relates to a magnetometer for detecting a communication signal. By "communication signal" is meant an indication of a field that is to be received or detected. In nonlimiting examples, the communication signal carries data.

The magnetometer includes at least one atomic vapor cell, a three-axis set of field coils arranged to apply a magnetic field to the vapor cell or cells, and a photodetector arranged to receive probe light that has passed through the vapor cell or cells. In use, a pump beam of light propagates through the vapor cell or cells along a longitudinal axis, referred to here as the z-axis. In use, the photodetector responds to the received probe light by providing an output signal that indicates a polarization state of the received probe light.

The magnetometer further includes driving circuitry for the field coils, which is configured to receive error signals for stabilizing a magnetic field on the vapor cell or cells and to controllably drive the field coils in three dimensions with electric currents that are responsive, in part, to the error signals.

In the magnetometer, demodulator circuitry is configured to produce error signals by demodulating a signal stream derived from the photodetector output signal. Demodulation with respect to a frequency $f_{LS}$ produces a first error signal, and demodulating with respect to a frequency $f_{TS}$ produces a second error signal.

The photodetector output signal is also directed on a signal path to a communication signal output port without demodulation to either of the frequencies frequency $f_{TS}$ and $f_{TS}$.

Some embodiments include a radio-frequency detector circuit configured to receive the photodetector output signal from the communication signal output port, and configured to detect, in the photodetector output signal, a communication signal at a radio frequency $f_{Comm}$ that is distinct from the frequencies $f_{LS}$ and $f_{TS}$.

In some embodiments, a single vapor cell contains atoms of two magnetically sensitive host species having respective gyromagnetic ratios $\gamma_1$ and $\gamma_z$ and the ratio $f_{Comm}/f_{TS}$ is substantially equal to the ratio $\gamma_1/\gamma_2$ or the ratio $\gamma_2/\gamma_1$. Example host species are rubidium-85, having a gyromagnetic ratio $\gamma_{85}$, and rubidium-87, having a gyromagnetic ratio $\gamma_{87}$, so that the ratio $f_{Comm}/f_{LS}$ is substantially equal to the ratio $\gamma_{85}/\gamma_{87}$ or the ratio $\gamma_{87}/\gamma_{85}$. By "substantially equal" is meant equal within experimental error.

In embodiments, the driving circuitry is configured to drive a slowly varying magnetic field directed along the z-axis in response to the first error signal, a slowly varying magnetic field directed perpendicular to the z-axis in response to the second error signals, an oscillating radio-frequency magnetic field directed perpendicular to the z-axis with oscillation frequency $f_{LS}$, and a rotating magnetic field directed in a plane perpendicular to the z-axis with rotational frequency $f_{TS}$.

In embodiments, the demodulator circuitry is cascaded such that the demodulation of the photodetector output signal with respect to $f_{LS}$ provides a once-demodulated output signal, and such that the once-demodulated output signal is demodulated with respect to $f_{TS}$ to provide a twice-demodulated output signal. An error signal for a magnetic field component parallel to the z-axis is derived from the once-demodulated output signal, and a two-channel error signal for magnetic field components perpendicular to the z-axis is derived from the twice-demodulated output signal.

In embodiments, the driving circuitry and the demodulator circuitry are implemented in a field-programmable gate array.

The invention in a second aspect relates to method for detecting a communication signal at a frequency $f_{Comm}$. The method comprises optically pumping a population of a first atomic species and a population of a second atomic species to prepare said first and second atomic species in magnetically sensitive atomic states; detecting magnetically resonant responses of the first and second atomic species; tuning a magnetic bias field to maximize a magnetically resonant response of the first atomic species at a frequency $f_{LS}$; and detecting a magnetically resonant response by the second atomic species at the $f_{Comm}$.

The first and second atomic species have respective gyromagnetic ratios $\gamma_1$ and $\gamma_2$, and the ratio $f_{Comm}/f_{LS}$ is substantially equal to the ratio $\gamma_1/\gamma_2$ or the ratio $\gamma_2/\gamma_1$. By "substantially equal" is meant equal within experimental error.

In embodiments, the first atomic species and the second atomic species are both contained within a common atomic vapor cell.

In embodiments, the tuning of the magnetic bias field comprises driving a three-dimensional set of field coils so as to apply corrections to the magnetic bias field in three dimensions.

In embodiments, the magnetically resonant response of the first atomic species is excited by an oscillating magnetic field of frequency $f_{LS}$.

In embodiments, the optical pumping comprises irradiating the first and second atomic populations with pump light propagating along a longitudinal axis, here denominated the z-axis; and the tuning of the magnetic bias field comprises generating longitudinal and transverse error signals, adding a correction to the magnetic bias field along the z-axis that is responsive to the longitudinal error signal, and adding a correction to the magnetic bias field perpendicular to the z-axis that is responsive to the transverse error signal.

The generation of the longitudinal error signal may comprise, for example, modulating the magnetic bias field by adding an oscillating magnetic field of frequency $f_{LS}$ perpendicular to the z-axis; detecting a magnetically resonant response to the oscillating magnetic field; and demodulating the detected response relative to the frequency $f_{LS}$.

The generation of the transverse error signal may comprise, for example, modulating the magnetic bias field by adding a rotating transverse magnetic field of rotational frequency $f_{TS}$ perpendicular to the z-axis; detecting a magnetically resonant response to the rotating transverse magnetic field; and demodulating the detected response relative to the frequency $f_{TS}$.

In embodiments, the demodulating relative to the frequency $f_{LS}$ provides a once-demodulated signal; the demodulating relative to the frequency $f_{TS}$ is a demodulation of the once-demodulated signal to provide a twice-demodulated signal; and the transverse error signal is derived from the twice-demodulated signal.

In various embodiments, the magnetically resonant responses may be detected, for example, by transmitting probe light through the first and second atomic species and detecting a state of polarization of the transmitted probe light.

In embodiments, a common wavelength of pump light achieves the optical pumping of both the population of a first atomic species and the population of a second atomic species.

In embodiments, one of the first and second atomic species is rubidium-85 and the other is rubidium-87. Thus, for example, the first and second atomic species may be provided by adding natural abundance rubidium to the atomic vapor cell.

DETAILED DESCRIPTION

Figure 1:
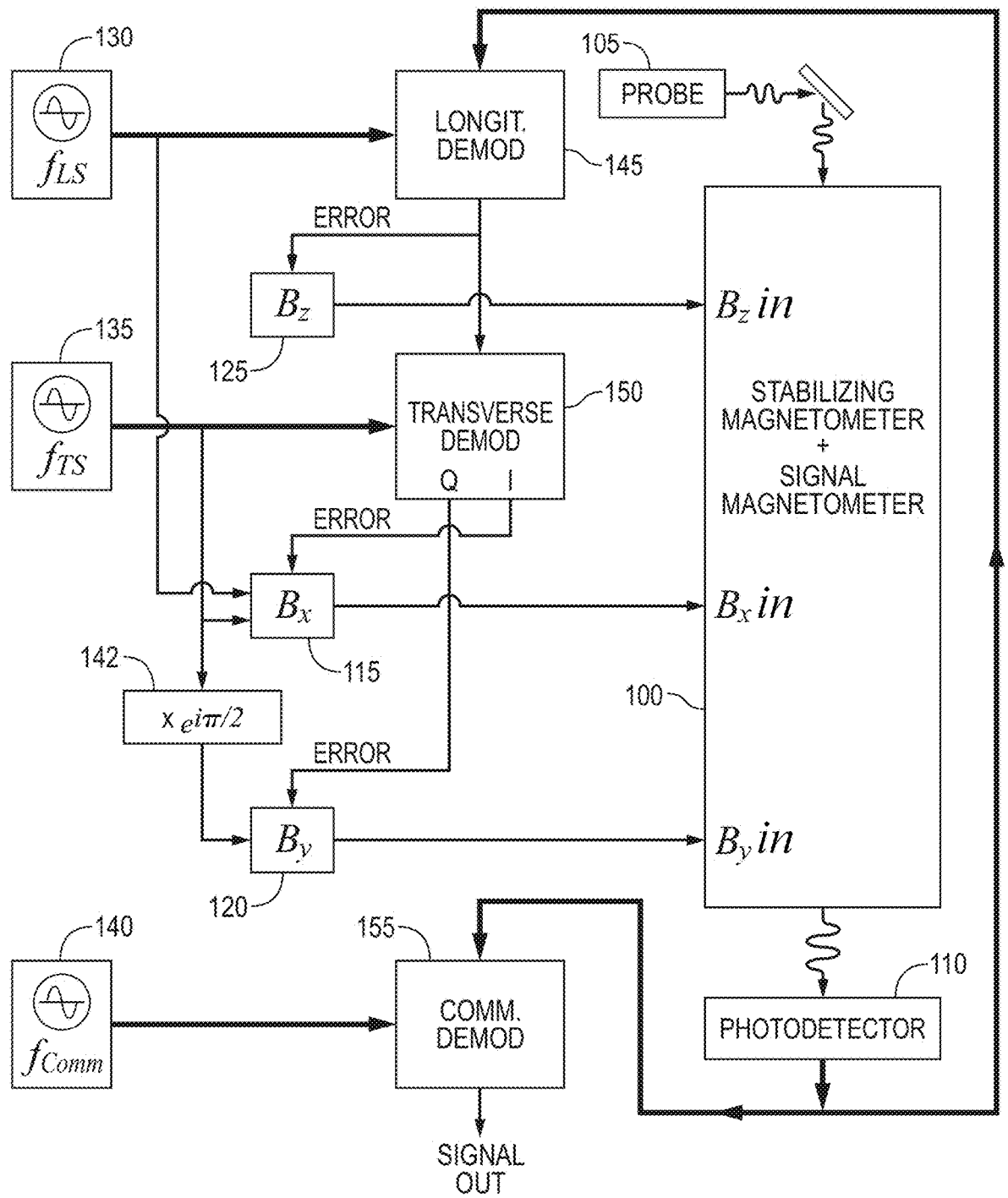
FIG. 1 is a notional block diagram illustrating the signal paths for feedback and control in a magnetometer according to principles discussed herein.

As explained above, our device functions as two coextensive, cooperating magnetometers, identified together as element 100 in FIG. 1, to which attention is now directed. Within a vapor cell, host atoms of two species are spin-polarized by a pump laser, which is not shown in the figure. Probe laser 105 generates a beam of light that interrogates the atomic vapor and is detected by balanced photodetector 110.

The vapor cell is subjected to a magnetic field imposed by magnetic coils aligned with each of the three coordinate axes to afford three-dimensional control over the imposed field. These magnetic field coils are not explicitly shown in the figure.

The field coils have a fourfold purpose: To apply corrections that null out the terrestrial magnetic field and other undesired magnetic fields, which we refer to collectively as "stray fields"; to impose a static, longitudinal magnetic bias field $B_0$, to impose a transverse radio frequency field that induces coherent spin precession of the host atoms, and to add modulations of $B_0$ at the transverse modulation frequency.

In the notional representation of FIG. 1, controller 115 drives the field coils for the x-component of the imposed transverse field, controller 120 drives the field coils for the y-component of the imposed transverse field, and controller 125 drives the field coils for the longitudinal z-component. It should be noted, however, that practical implementations may use different coils, with different controllers and drivers, for the static, low-frequency modulated, and high-frequency modulated components of the field in a given direction. Hence, the simplified representation in FIG. 1 should not be deemed limiting in this regard.

Error signals are created by modulating the imposed field at selected frequencies and by using phase-locked detection with, e.g., a digitally implemented lock-in amplifier, to demodulate the photodetector output at the selected frequencies. Notionally, but not for purposes of limitation, FIG. 1 shows frequency generator 130 for the longitudinal modulation and demodulation at frequency $f_{LS}$, and frequency generator 135 for the transverse modulation and demodulation at frequency $f_{TS}$.

It should be understood that "longitudinal modulation at frequency $f_{LS}$" refers to the transverse radio frequency field that induces coherent spin precession. It is called "longitudinal" because demodulation of the magnetometer response relative to $f_{LS}$ provides the error signal that is used for stabilizing the longitudinal component of the magnetic bias field. Accordingly, the generated waveform at frequency $f_{LS}$ is shown in FIG. 1 as directed to x controller 115 for driving a field component in a transverse direction.

Figure 4:
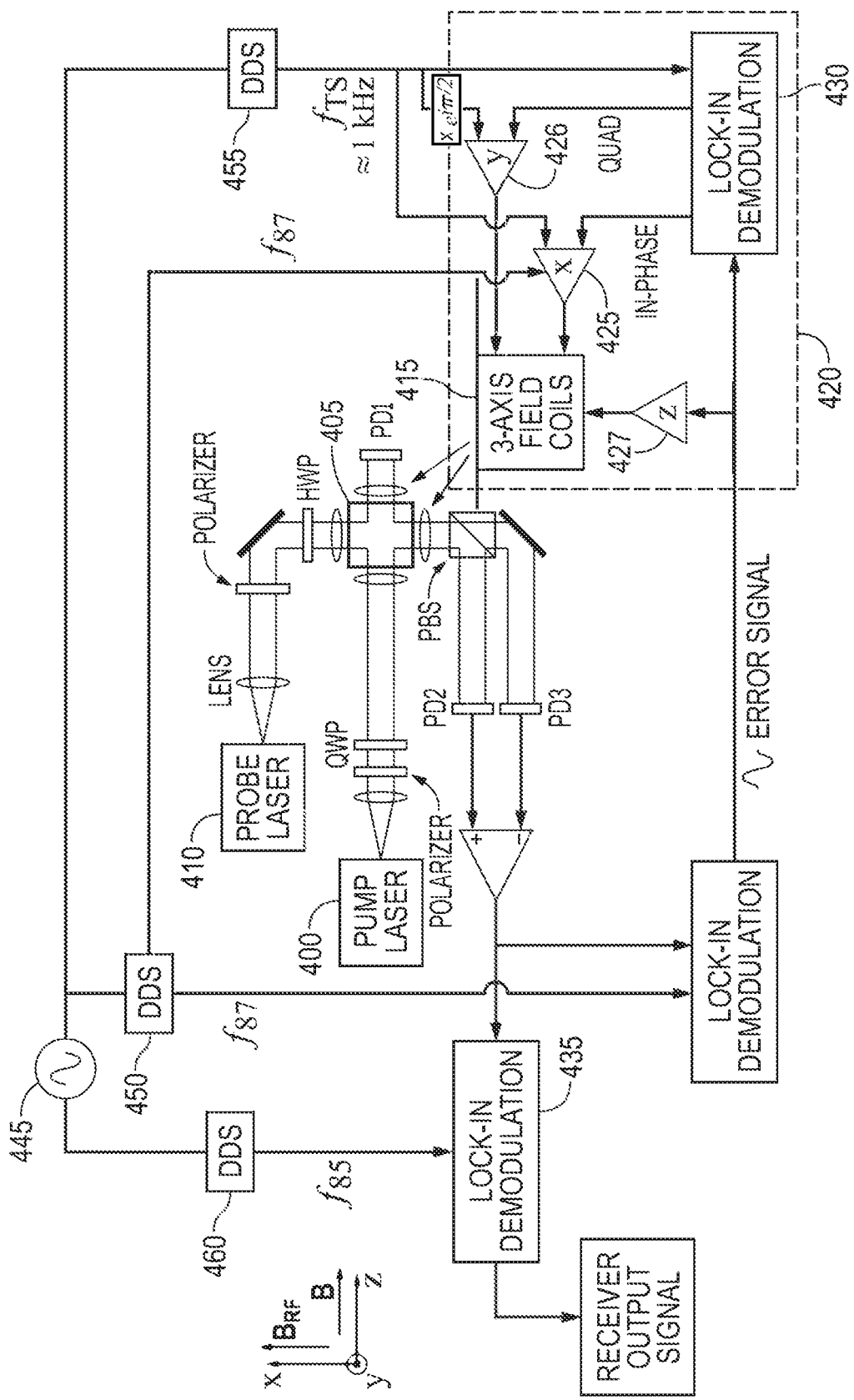
FIG. 4 is a system diagram for an example embodiment of the magnetometer that uses 85Rb and 87Rb in natural abundance rubidium vapor as the host species.

An optional frequency generator 140 for frequency/co. is also included in the figure. Such a frequency generator could provide a phase reference for demodulating the communication signal at the desired RF communication by, e.g., lock-in detection, as also shown in FIG. 4. However, given a sufficient signal-to-noise ratio, we have found that a phase reference is not needed for demodulating the communication signal.

The frequency generators may be implemented digitally.

As represented symbolically by phase shifter 142 in the figure, the waveform generated by frequency generator 135 is advanced by 90° (i.e., by π/2 radians) before it is applied to y-axis controller 120. The relative phase shift between the x-axis and y-axis controllers produces the rotating transverse modulation field discussed above.

As symbolically represented in FIG. 1, the servo system is implemented, in part, by demodulators 145 and 150. The photodetector output is demodulated at demodulator 145 with respect to frequency $f_{LS}$ to generate the error signal fed back to longitudinal controller 125. This once-demodulated error signal is demodulated a second time at demodulator 150 at frequency $f_{TS}$ to generate the error signals fed back to the transverse controllers. More specifically, demodulator 150 has an in-phase output I and a quadrature output Q. The I output provides the error signal fed back to x-axis controller 115, and the Q output provides the error signal fed back to y-axis controller 120.

The photodetector output is optionally demodulated at demodulator 155 to recover the desired RF communication signal.

The magnetic resonances that produce the error signals as well as the RF communication signal occur at the Larmor frequencies of the host atoms in the total ambient magnetic field. These Larmor frequencies depend only on the magnitude of the total field experienced by the host atoms, and they are independent of its direction. To stabilize the field, the longitudinal stage of the servo system corrects its magnitude, and the transverse stage corrects its direction.

Figure 2A:
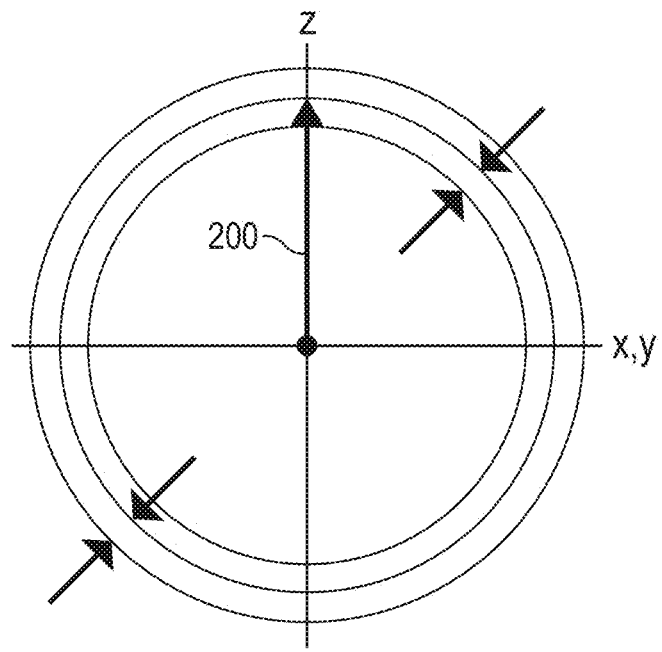
FIGS. 2A and 2B are sketches that geometrically illustrate a principle, discussed herein, for feedback stabilization of the magnitude of an ambient magnetic field.

FIG. 2A is a graph in which the vertical axis is the z-axis, and the horizontal axis is one of the two transverse axes, i.e., the x-axis or the y-axis. Three concentric circles are drawn on the graph, representing the desired magnitude of $B_0$ (central circle), a slightly greater magnitude (outer circle), and a slightly smaller magnitude (inner circle). A vector 200 representing the ideal value of $B_0$ is drawn on the graph, extending along the z-axis from the origin to the central circle.

Figure 2B:
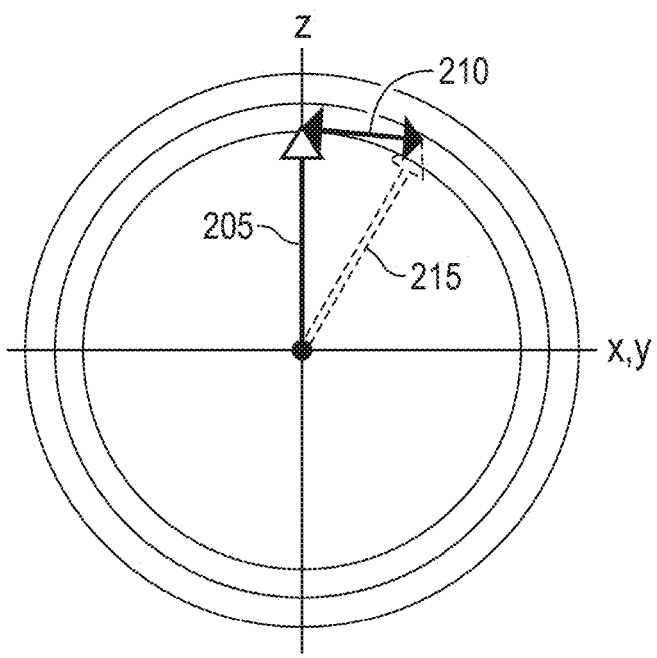

Double arrows in the figure indicate increments that will appear in the longitudinal error signal, with the appropriate sign, when the magnitude of $B_0$ is too large or too small, irrespective of its direction. Thus, the z-component of $B_0$ may fall short, but if $B_0$ acquires a transverse component that compensates the shortfall so that the desired magnitude is maintained, a longitudinal error will not be detected. This situation is illustrated in FIG. 2B, where the z-component 205 reaches only to the inner circle on the graph, but because there is a transverse component 210, the $B_0$ vector 215 still reaches to the central circle.

Figure 3A:
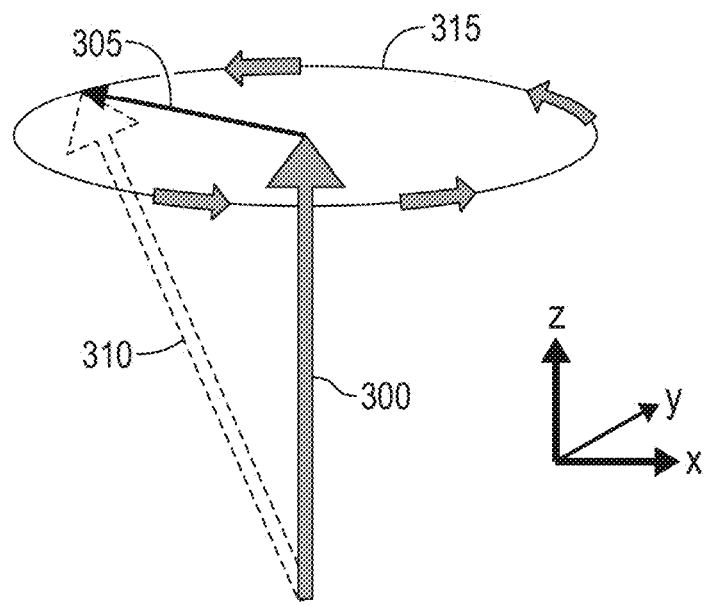
FIGS. 3A and 3B are sketches that geometrically illustrate a principle, discussed herein, for feedback stabilization of the direction of an ambient magnetic field.
Figure 3B:
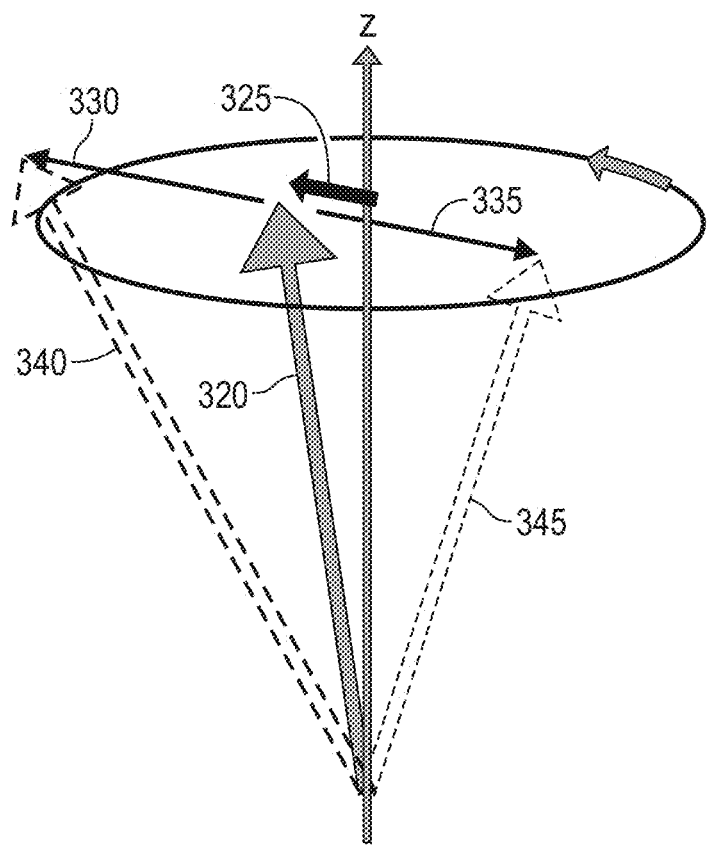

FIGS. 3A and 3B illustrate how the transverse stage of the servo system can detect error in the direction of $B_0$. The scheme illustrated here is known. It has been described, for example, in E. B. Alexandrov et al., "Three-component variometer based on a scalar potassium sensor," *Meas. Sci. Technol.* 15 (2004) 918-922, the entirety of which is hereby incorporated herein by reference.

FIG. 3A shows the effect of modulating the ideal $B_0$ vector by adding a small, rotating transverse field. The ideal vector 300 is shown extending along the z-axis. The modulation at a given instant of time is represented as a transversely directed vector 305. The resultant 310 obtained by adding the ideal, z-directed $B_0$ vector to the transverse vector is shown with broken lines. As indicated in the figure, this resultant will have a constant magnitude, and it will follow the circular trajectory 315 shown in the figure as the modulation field rotates.

FIG. 3B shows what happens when the modulation is added to a $B_0$ vector 320 that is no longer ideal because it has acquired a transverse component 325. During one half of each cycle, the modulation 330, 335 will add constructively to the transverse component, thereby increasing the magnitude of the resultant field 340, 345. During the other half of each cycle, the modulation will add destructively to the transverse component, decreasing the magnitude of the resultant field. This will produce a sinusoidal oscillation in the ambient field at the transverse modulation frequency. The phase of this oscillation indicates the direction of the transverse component acquired by $B_0$. The phase information is recoverable by using both the I and Q outputs of the transverse demodulator.

FIG. 4 is a system diagram for an example embodiment of the magnetometer that uses $^{85}$Rb and $^{87}$Rb in natural abundance rubidium vapor as the host species. Accordingly, the longitudinal stabilization frequency referred to above as $f_{LS}$ is represented in the figure as $f_{87}$, and the communication signal frequency referred to above as $f_{Comm}$ is represented in the figure as $f_{85}$.

Turning to the figure, pump laser 400 is seen producing a pump beam that is conditioned by optical elements including a linear polarizer and a quarter wave plate QWP to circularly polarize the beam before it passes through vapor cell 405. A photodetector PD1 can be used to monitor the pump beam downstream of the vapor cell.

Probe laser 410 is seen producing a probe beam that is conditioned by optical elements including a linear polarizer before it passes through the vapor cell, where the direction of linear polarization may be rotated by interaction with the atomic vapor. Downstream of the vapor cell, a polarization beam splitter PBS separates the probe beam into two beams with respective, mutually orthogonal linear polarizations, and the two beams impinge respective photodetector elements PD2 and PD3 of a balanced photodetector. A signal indicative of the rotated polarization direction is obtained by taking the difference between the voltage outputs of photodetector elements PD2 and PD3.

Turning to the set of coordinate axes shown in the figure, it will be seen that the propagation axis of the pump beam is designated as the z-axis. This is the longitudinal axis for the overall system, including the servo system. The vertical axis in the view of the figure is the x-axis, and the axis coming perpendicularly out of the page toward the viewer is the y-axis. The direction of the probe laser as shown in FIG. 4 is the negative x-direction. This direction is perpendicular to the pump axis, as is required for maximum sensitivity. In the illustrated example, the direction of the longitudinal modulation is also along the x-axis.

The three-axis field coils 415 are shown in the figure as under the control of magnetic field control system 420. Within the magnetic field control system, the control for the field coils is functionally represented by the x, y, and z error amplifiers 425, 426, 427, respectively. The longitudinal and transverse demodulation is functionally represented by lock-in demodulator 430. Lock-in demodulator 435 is shown as demodulating the photodetector output to provide the receiver output signal although, as noted above, there are various modes of reception that do not such demodulation.

Typical field amplitudes for the longitudinal modulation are in the range 1 nT to 500 nT. Amplitudes of one hundred to several hundred nanotesla are typical for the transverse modulation. The static bias field is typically one to one thousand times the modulation field. An exemplary value for the longitudinal field is about 4,500 nT, which would produce an $^{87}$Rb resonance at about 30 kHz.

The implementation represented here is digital. Accordingly, the modulation and demodulation waveforms are created by direct digital synthesizers (DDSs) responding to a reference oscillator. In the figure, element 445 is the reference oscillator, DDS 450 generates the longitudinal modulation/demodulation frequency labeled here as $f_{87}$, DDS 455 generates the transverse modulation/demodulation frequency $f_{TS}$, and DDS 460 generates the demodulation frequency for the RF communication signal, labeled here as $f_{85}$.

In a non-limiting example using $^{85}$Rb and $^{87}$Rb as the host species, the desired communication frequency $f_{Comm}$ for RF reception or detection is 21.5 kHz. The corresponding frequency $f_{LS}$ for longitudinal RF modulation is 32.25 kHz. This RF servo frequency can be generated by, e.g., a high-precision signal generator. Such a signal generator can be implemented in a field-programmable gate array (FPGA). Thus, for example, the FPGA can generate a 16-bit waveform that is fed to a direct digital synthesizer, and the output of the DDS becomes the desired analog signal.

In addition to the host atoms, the vapor cell contains a buffer gas, typically nitrogen. Heating of the atomic vapor is provided by a resistive wire carrying a high-frequency current with a frequency of, e.g., 1 MHz. The high frequency is necessary to avoid producing a magnetic field that interferes with the operation of the magnetometer. Generally, coherence of the atomic states can be maintained up to a vapor temperature of about 200° C. A typical vapor temperature in operation is 130° C.

By way of illustration, a current embodiment implements the frequency generation and signal processing in a PXIe 7857 Reconfigurable I/O Board, which is an FPGA commercially available from National Instruments, a corporation with offices at 11500 N Mopac Expressway, Austin, Texas 78759-3504. In use, the output of the frequency generator is sampled at ten times the intended output frequency or somewhat more, and it is then passed through a third-order low-pass analog filter to produce a clean output at the intended frequency.

Analog filtering is used to reject noise from the high-gain magnetic field coils, and as reconstruction filters for smoothing the digitized analog signal sampled at a finite rate.

In a current embodiment, for example, each feedback channel is filtered so as to pass only frequencies below 1 kHz. This is primarily to ensure that the noise at the detection frequency is filtered out.

The longitudinal modulation is bandpass-filtered with a passband of about 10 kHz to about 50 kHz. The high-frequency cutoff is chosen to reject artifacts from 500-kHz sampling of the waveform, and as such, to provide the functionality of a reconstruction filter. The low-frequency cutoff is chosen to reject low-frequency content that could influence the low-frequency bias field.

The transverse modulation channels are low-pass filtered at 1 kHz, primarily for reconstruction filtering to reject artifacts due to sampling at 10 kHz. Because these signals are relatively weak, noise is less of a concern for them.

In the illustrative embodiment, the FPGA is the platform for performing the cascaded lock-in demodulations and for processing the feedback signals of the servo system. The FPGA is also the platform for combining modulation components as required, and for applying such overall offset levels as may be needed. The driving circuits for the field coils can also be implemented in the FPGA. However, externally powered amplifiers are needed to provide the currents for the field coils.

As pointed out above, the polarization of the probe beam is rotated due to the precession of the atomic polarization vector, which leads to modulation at the RF frequency. As also pointed out, the polarization is measured by the balanced photodetector. Near the magnetic resonance, demodulation of the photodetector output at the longitudinal frequency $f_{LS}$ produces a signal with distinctive features when it is plotted as a response curve versus the amount of detuning from the Larmor precession frequency. The detuning may be the result of a change in RF frequency, or it may be the result of a change in the magnetic bias field that determines the resonant frequency.

Figure 5:
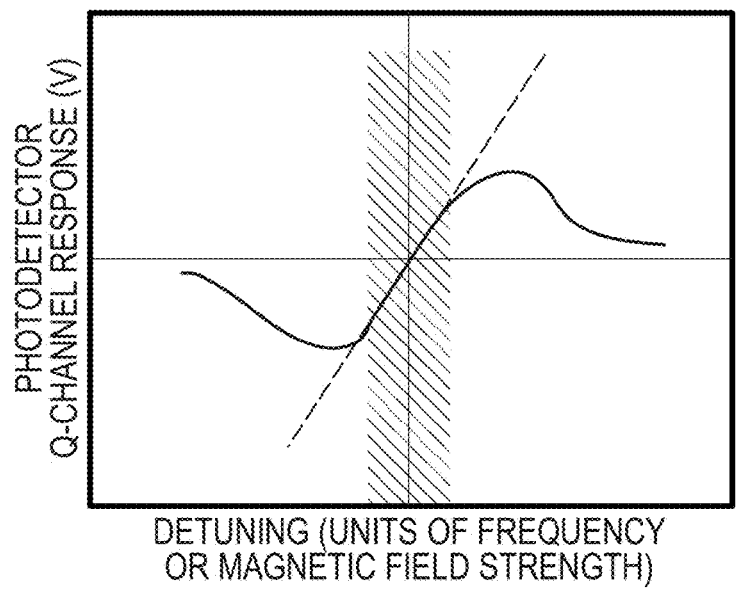
FIG. 5 is a pedagogical example of a typical dispersive lineshape for a magnetic resonance signal.

The near-resonance I-channel signal exhibits a peak that has a maximum value at resonance and falls off on either side of the peak with increasing detuning. By contrast, the Q-channel signal exhibits a so-called "dispersive" lineshape. An example is provided in FIG. 5. As can be seen in the figure, this lineshape has an approximately linear region in the vicinity of the resonance, with a zero crossing at the resonance. When operating in the linear region, the value of the Q-channel signal directly provides an error signal for servoing the longitudinal component of the magnetic field.

The transverse modulation frequency $f_{TS}$ is much less than the longitudinal modulation frequency. Typical values are in the range 500 Hz to 1 kHz. For transverse modulation fields with magnitudes much less than $|B_0|$, the transverse modulation can be regarded as a slow modulation that moves up and down along the linear slope provided by the once-demodulated longitudinal error signal.

As explained above, the respective transverse error signals fed back to the x-axis controller and to the y-axis controller are obtained by further lock-in demodulating the once-demodulated longitudinal error signal. This second demodulation is performed relative to the transverse modulation frequency.

Because feedback of the transverse error signals nulls out transverse field components, the action of the longitudinal feedback loop is left to bring the longitudinal field, alone, to the correct bias point. It is important, though, that for proper functioning, the transverse modulation must not be too large. Further, the longitudinal servo must maintain the overall response near resonance in order for the transverse servos to function correctly.

Accordingly, the stabilizing magnetometer based on, e.g., the $^{87}$Rb signal is able to stabilize ambient field conditions so that the signal magnetometer based on, e.g., the $^{85}$Rb signal is maintained at its optimal sensitivity. We believe that the resulting stabilization is not only quasistatic, but can, in fact, achieve feedback bandwidths up to about 250 Hz on all channels.

The principles of operation of the magnetometer will now be described in greater detail. A vapor cell containing host atoms is placed in a static magnetic bias field $B_0\hat{z}$ that produces a splitting of atomic energy levels due to the Zeeman effect. A circularly polarized pump laser optically pumps the atoms along $\hat{z}$. A weak RF field with a magnetic field vector perpendicular to the static field and tuned to the Zeeman resonance of the atoms induces a transverse rotating component of the spin polarization. This rotating polarization component is a manifestation of coherent spin precession due to the resonant RF excitation. The rotating polarization component is detected from its effect on the polarization of a probe laser beam directed along $\hat{x}$.

The host atoms are typically atoms of an alkali metal. The Larmor frequency $\omega_0$ for alkali metal atoms is given by $$\omega_0 = \frac{\gamma B_0}{(2I+1)\hbar} \approx 2\pi \times (2.8 \text{ MHz}/Gauss)B_0/(2I+1),$$

where I is the nuclear spin of the atoms and $\gamma$ is the electronic gyromagnetic ratio. If the atoms are nearly completely polarized along $\hat{z}$, a resonant oscillating magnetic field $B_1\hat{y}\cos\omega_0 t$ will cause a transverse polarization response equal to $$P_x = \frac{F_x}{F_z} = (1/2)\gamma B_1 T_2 \sin\omega_0 t,$$

where $T_2$ is the transverse spin relaxation time and $F_x$ and $F_z$ are the spin orientations along the transverse and longitudinal axes, respectively.

In the illustrative example described above, the host species are $^{85}$Rb and $^{87}$Rb in natural abundance rubidium. Natural rubidium is about 72% $^{85}$Rb and about 28% $^{87}$Rb. We chose the more abundant isotope for the communication signal detection because it would offer higher sensitivity.

The nuclear spin of $^{85}$Rb is 5/2, and the nuclear spin of $^{87}$Rb is 3/2. Hence, the ratio of the corresponding Zeeman transition frequencies is $[2\times(3/2)+1]/[2\times(5/2)+1]=2/3$. It should be noted, however, that this relation assumes relatively low fields. As the fields become large, nonlinear terms arise as the field strength transitions toward the Paschen-Back regime of nonlinear splitting, and the relation is no longer valid, in general.

The Zeeman transition of $^{87}$Rb used in the illustrative example was between the $|F, m_F\rangle=|2,1\rangle$ and $|F, m_F\rangle=|2, 2\rangle$ states of the ground-state hyperfine manifold. The Zeeman transition of $^{85}$Rb was between the $|F, m_F\rangle=|3, 2\rangle$ and $|F, m_F\rangle=|3, 3\rangle$ states of the ground-state hyperfine manifold.

The strength of the magnetic bias field that achieved the desired resonances was 4.6 µT. Typical values for the magnetic field strength for the longitudinal modulations were about 3 nT, and for the transverse modulations, they were about 46 nT.

When pumped with circularly polarized pump light, the atoms will absorb angular momentum until they reach saturation. The atoms consequently attain a so-called "stretched" end state, $|F_a=I+\frac{1}{2}, m_F=\pm F_a\rangle$, where the sign of $m_F$ is determined by the handedness of the circular polarization. The RF field (i.e., the "longitudinal modulation") then drives the coherent oscillation between $|F_a, m_F=\pm F_a\rangle$ and $|F_a, m_F=\pm(F_a-1)\rangle$.

In the illustrative example, the pump and probe wavelengths were both on the rubidium D1 line at 795 nm. The pumping was on the $^2S_{1/2} \rightarrow ^2P^{1/2}$ transition for both isotopes. It is noteworthy in this regard that due to pressure broadening from the nitrogen buffer gas, the linewidth of the optical resonance was about 8 GHz, which is much greater than the difference in resonance frequency between the two species.

The pump beam and probe beam were applied in continuous wave (cw) operation. Both host species were pumped effectively with the use of a single pump source.

Although we do not wish to be limited by mechanism, we believe that at least two effects help make it possible for the same pump beam to produce the requisite spin polarization for both host species: Spin-exchange collisions between species can distribute spin polarization quickly between species, even if one species has a higher optical absorption rate for the pump radiation than the other species. However, even without that effect, there is pressure broadening of the optical resonance due to buffer gas, typically nitrogen, within the vapor cell. At least for the $^{85}$Rb/$^{87}$Rb system used in our example, the pressure broadening leads to only one well-resolved optical resonance for both species, with the result that both are efficiency pumped directly by the laser.

It should be noted that the $^{85}$Rb/$^{87}$Rb system is only one non-limiting example of a pair of host species that can be used in the present context. It is well-known in the art to use not only atoms of rubidium, but also various other metal atoms as host species for atomic magnetometry, particularly the alkali metals potassium and cesium. Two isotopes of a host element other than rubidium could possibly be used, or even atoms of two different host elements. One possible example would use $^{87}$Rb-enriched rubidium mixed with cesium. All of these possibilities should be understood to fall within the scope of the present disclosure.

Further, the techniques described here are not limited to the use of a single pump source. Each of two different host species could be pumped with a respective wavelength of light from its own pump source. In at least some cases, however, spin-exchange collisions between species may transfer spin polarization so effectively that a second pump is not needed. In fact, it may be beneficial to perform signal detection using the species that is indirectly pumped through spin exchange, because broadening effects due to spatial inhomogeneity of the pump-beam profile would be reduced.

Accordingly, there are many potential systems of host species that can be used in the present context. What is common to all of them is that the two participating species must have different gyromagnetic ratios, so that they can operate at separated center frequencies within the same bias field. (The gyromagnetic ratio is proportional to the nuclear spin.)

Preferably, the resonance responses from the two species will have minimal overlap. A practical limit on the overlap can be defined in terms of the half-width at half-maximum (HWHM) of the resonance peaks. Roughly, the limit is where the sum of the two respective half-widths is equal to the separation between the center frequencies. The isotopes $^{85}$Rb and $^{87}$Rb have about the same half-width, so their sum is one full-width at half maximum, leading to a limit where the full-width is equal to the spacing between the center frequencies of the two resonances. The measured full-width in our example implementation is about 5.7 kHz, which implies that, as a matter of practice, the detection frequency, which corresponds to the $^{85}$Rb resonance, can be as low as 11 kHz.

Example

A magnetometer substantially as described above and using the $^{85}$Rb/$^{87}$Rb system of host species was operated, for evaluative purposes, within a four-layer, mu-metal magnetic shield. The volume of the vapor cell was about one cubic centimeter. The vapor cell was filled with nitrogen buffer gas to a nominal pressure of 200 torr. Measurements based on pressure broadening yielded a pressure of 285 torr. In operation, the cell temperature was 120° C-130° C.

The pump and probe laser beams both had a 1/e$^2$ diameter of about 8 mm. The probe optical power was 20 mW-30 mW cw, and the pump optical power was 5 mW-20 mW.

Two three-axis coil sets were used, one for high current and one for low current. The high-current coils were used for feedback and bias. The low-current coils were used for modulation. The RF modulation was applied through the x-axis modulation coil.

Figure 6:
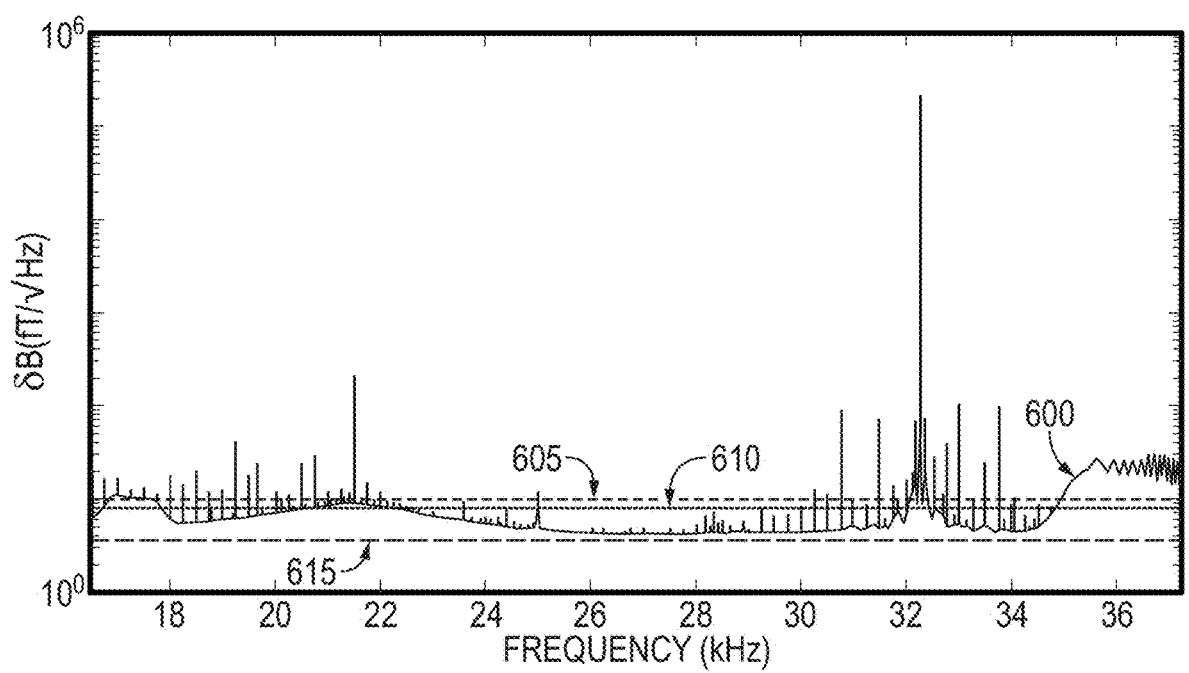
FIG. 6 is a graph of experimental data that illustrate the sensitivity of a prototype magnetometer of the kind described herein.

FIG. 6 is a graph that illustrates the sensitivity of the magnetometer. Curve 600 is a plot of calibrated rms instrument response normalized by the measurement bandwidth. Curve 605 is a horizontal line marking a sensitivity of 10 fT/Hz$^{1/2}$. Curve 610 is a horizontal line marking the value, at 21.5 kHz, of the noise floor within the magnetic shield as provided by the manufacturer. Curve 615 is a horizontal line marking an experimentally obtained value for the shot noise in the photodetector current.

Noise appearing at discrete frequencies is believed to be due primarily to line-frequency harmonics, harmonics of the transverse modulation frequency, and their sums and differences.

We claim:

1. A magnetometer for detecting a communication signal, comprising:
   an atomic vapor cell having a longitudinal propagation axis for a pump beam of light, here denominated the z-axis;
   a three-axis set of field coils arranged to apply a magnetic field to the vapor cell;
   a photodetector arranged to receive probe light that has passed through the vapor cell and to provide, in response thereto, an output signal that indicates a polarization state of the received probe light; and
   driving circuitry for driving the field coils, wherein:
   the driving circuitry is configured to receive error signals for stabilizing a magnetic field on the vapor cell and to controllably drive the field coils in three dimensions with electric currents that are responsive, in part, to the error signals;
   the magnetometer further comprises demodulator circuitry configured to demodulate a signal stream derived from the photodetector output signal with respect to a longitudinal demodulation frequency $f_{LS}$, thereby to produce a first one of the error signals, and to demodulate a signal stream derived from the photodetector output signal with respect to a transverse demodulation frequency $f_{TS}$, thereby to produce a second one of the error signals; and
   the magnetometer further comprises a communication signal output port and a signal path thereto for the photodetector output signal, such that the photodetector output signal is delivered to said output port without demodulation with respect to the frequency $f_{LS}$ or the frequency $f_{TS}$, the communication signal at a radio frequency $f_{Comm}$;
   wherein:
   the vapor cell contains atoms of two magnetically sensitive host species having respective gyromagnetic ratios $\gamma_1$ and $\gamma_2$, and
   a ratio $f_{Comm}/f_{LS}$ is substantially equal to a ratio $\gamma_1/\gamma_2$ or a ratio $\gamma_2/\gamma_1$.

2. The magnetometer of claim 1, further comprising a communication demodulator configured to receive the photodetector output signal from the communication signal output port, and configured to detect, in said photodetector output signal, the communication signal at the radio frequency $f_{Comm}$ that is distinct from the frequencies $f_{LS}$ and $f_{TS}$.

3. The magnetometer of claim 1, wherein the driving circuitry is configured to drive:
   a slowly varying magnetic field directed along the z-axis in response to the first one of the error signals;
   a slowly varying magnetic field directed perpendicular to the z-axis in response to the second one of the error signals;
   an oscillating radio-frequency magnetic field directed perpendicular to the z-axis with oscillation frequency $f_{LS}$; and
   a rotating magnetic field directed in a plane perpendicular to the z-axis with rotational frequency $f_{TS}$.

4. The magnetometer of claim 1, wherein:
   the demodulator circuitry is cascaded such that the demodulation of the photodetector output signal with respect to $f_{LS}$ provides a once-demodulated output signal, and such that the once-demodulated output signal is demodulated with respect to $f_{TS}$ to provide a twice-demodulated output signal;
   an error signal for a magnetic field component parallel to the z-axis is derived from the once-demodulated output signal; and
   a two-channel error signal for magnetic field components perpendicular to the z-axis is derived from the twice-demodulated output signal.

5. The magnetometer of claim 1, wherein the driving circuitry and the demodulator circuitry are implemented in a field-programmable gate array.

6. The magnetometer of claim 1, wherein:
   the vapor cell contains rubidium-85 having a gyromagnetic ratio $\gamma_{85}$ and rubidium-87 having a gyromagnetic ratio $\gamma_{87}$; and
   a ratio $f_{Comm}/f_{LS}$ is substantially equal to a ratio $\gamma_{85}/\gamma_{87}$ or a ratio $\gamma_{87}/\gamma_{85}$.

7. The magnetometer of claim 1, further comprising a pump laser configured to generate the pump beam to optically pump atoms of the two magnetically sensitive host species to prepare said two magnetically sensitive host species in magnetically sensitive atomic states.

8. The magnetometer of claim 1, wherein a magnetically resonant response of atoms of a first of the two magnetically sensitive host species is excited by an oscillating magnetic field of frequency $f_{LS}$.

9. The magnetometer of claim 1, further comprising a probe laser configured to generate the probe light.

\* \* \* \* \*